United States Patent [19]

Penza

[11] Patent Number: 5,666,088
[45] Date of Patent: Sep. 9, 1997

[54] WIDE FREQUENCY RANGE VCO WITH LOW JITTER

[75] Inventor: Luigi Penza, Vimercate, Italy

[73] Assignee: SGS-Thomson Microelectronics S.r.l., Agrate Brianza, Italy

[21] Appl. No.: 611,290

[22] Filed: Mar. 6, 1996

[30] Foreign Application Priority Data

Mar. 7, 1995 [EP] European Pat. Off. .............. 95830081

[51] Int. Cl.$^6$ .................. H03B 5/04; H03L 7/099
[52] U.S. Cl. .................. 331/34; 331/57; 331/175
[58] Field of Search .................. 331/34, 57, 175

[56] References Cited

U.S. PATENT DOCUMENTS

| | | | |
|---|---|---|---|
| 4,912,433 | 3/1990 | Motegi et al. | 331/57 |
| 5,285,483 | 2/1994 | Ogawa et al. | 375/120 |

OTHER PUBLICATIONS

Schuster et al., "On-Chip Test Circuitry for a 2-ns Cycle, 512-kb CMOS ECL SRAM," *IEEE Journal of Solid-State Circuits*, 27:7, Jul. 1992, pp. 1073–1079.

Vanstraelen et al., "Design implications of a p-well CMOS technology for the realization of monolithic integrated pixel arrays," *Nuclear Instruments and Methods in Physics Research*, A305:3, pp. 541–548. Aug. 1, 1991.

*Primary Examiner*—Siegfried H. Grimm
*Attorney, Agent, or Firm*—David V. Carlson; Michael J. Donohue; Seed and Berry LLP

[57] ABSTRACT

Each starved-inverter of a voltage controlled ring oscillator has an output transfer gate associated therewith. The pair of complementary switches composing a transfer gate being controlled in common with the relative current generators of the starved-inverter stage, by a frequency control voltage and by a voltage difference between a supply voltage and the control voltage, respectively. The frequency produced by the oscillator is linearly proportional to the control voltage and inversely proportional to the square root of the supply voltage, for an enhanced noise immunity and improved frequency stability.

23 Claims, 3 Drawing Sheets

WIDE FREQUENCY RANGE VCO WITH LOW JITTER

TECHNICAL FIELD

The present invention relates to a voltage controlled ring oscillator (VCO) with a wide frequency range and enhanced noise immunity, particularly suited for implementing phase locked loop (PLL) control systems.

BACKGROUND OF THE INVENTION

Phase locked loop systems (PLLs) are often integrated in very large scale integration (VLSI) devices, typically in integrated circuits (ICs) for application specific ICs (ASICs), microprocessors, and the like.

PLLs are often used as frequency synthesizers capable of generating square wave frequencies that may vary from 10 to over 200 MHz starting from an input clock signal with a frequency commonly comprised between 1 and 4 MHz.

PLLs are also used for square shaping or reshaping clock signals, for recovering digital data, etc. Whichever the type of application, PLLs must have a short-term instability of the output frequency (output jitter) as low as possible. In other words, they must be highly immune to causes of short-term instabilities, in other words, to high frequency noise.

The presence of jitter is highly detrimental in VLSI applications because the output square wave produced by the PLL system has a degree of uncertainty of the rise and fall fronts, which, if used as system clock signal, may negatively affect systems because of a reduction of the time-scale margins for a correct handling of data and of the data retention time.

Very often PLL systems must ensure a maximum instability of the switching fronts of the output signal below about 0.5 nanoseconds (ns), notwithstanding the fact that they must function in a relatively noisy "environment."

Short-term instability (jitter) in VCO, realized in an integrated circuit using VLSI CMOS technology, is primarily caused by the high frequency noise that is generated within the integrated circuit and which is injected in the VCO of a PLL through the supply rails Vdd and ground, as well as through the control voltage (Vc) line of the output frequency generated by the VCO.

A block diagram of a frequency synthesizer based on a PLL employing a voltage controlled oscillator (VCO) is depicted in FIG. 1.

Notwithstanding that the behavior of a phase locked loop is in some measure similar to that of an adaptive filter and that therefore the long-term instabilities of the input clock signal are effectively filtered, short-term instability caused by the noise coming from the supply rails and from the control voltage line remains a difficult problem to be solved, especially in VLSI devices.

Among the circuit blocks that comprise a PLL, the phase and frequency detector (PFD) and the low pass filter are intrinsically immune to short-term instabilities, while the frequency divider (1/N), generates a negligible jitter as compared with the high frequency noise that is normally present at the output of the VCO block. Therefore, it may be said that the control of jitter in a PLL requires a voltage controlled oscillator having a high immunity toward high frequency noise.

Substantially, most of the times in VLSI applications, the VCO employed for implementing a PLL consists of a voltage controlled ring oscillator. A ring oscillator offers a high gain and a great stability in a relatively simple and least burdensome way.

A typical architecture of a VCO is depicted in FIG. 2. The VCO is implemented by a plurality (odd number) of inverting (delay) stages connected in cascade, each delay stage commonly being a so-called starved-inverter comprising transistors M1, M2, M3 and M4. Each inverting stage is often followed by a Schmitt trigger circuit S1 for providing a partial filtering of short-term frequency instabilities.

In a starved-inverter, the transistors M1 and M4, controlled by the output signals produced by the voltage-current control converter, act as current sources, while the transistors M2 and M3 work essentially as digital switches by enabling the source and sink currents. Therefore, the node n1 is alternately charged and discharged, thus causing the switching of the output Schmitt trigger S1 associated with the inverting stage when its triggering thresholds (in the two switching directions) are crossed. The signals propagate through the N inverting stages of the oscillator producing a square wave output signal F-OUT.

Because of the hysteresis toward the input voltage signal switchings, the use of a Schmitt trigger at the output of each inverting stage of the ring oscillator tends to reduce the instability of the switching point of the inverting stage.

However, the noise that is injected through the control voltage line Vc as well as through the supply rails Vdd and GND, in practice, modulates the switching thresholds of the various inverting (delaying) stages that compose the ring oscillator thus causing a jitter of the switching fronts of the output signal.

Moreover, in known VCOs the output frequency varies linearly with the supply voltage and the power supply rejection (PSR) is intrinsically poor. Furthermore, the frequency produced by the VCO increases with the supply voltage and this makes the transfer function of the PLL (and therefore its stability) strongly dependent on the operating voltage unless effective but costly voltage regulation circuits are implemented. Notwithstanding the use of a Schmitt trigger at the output of each inverting delay stage of the ring oscillator, the amount of noise that is effectively filtered out is relatively modest. In a circuit working at 5V, a PSR of 10%/V is normal in known systems.

There is clearly a need for a voltage controlled oscillator (VCO) that, though being based on a ring oscillator architecture, offering a relative intrinsic stability, high gain and sturdiness with a relatively modest and least burdensome circuit complexity, has a markedly reduced sensitivity to supply voltage variations and an enhanced hysteresis of each inverting stage so as to ensure a higher rejection of high frequency noise. The circuit should remain easily integrable in CMOS technology.

SUMMARY OF THE INVENTION

A method for markedly improving the ability to reject disturbances coming from the supply rails and from the control voltage line of a voltage controlled ring oscillator has now been found and represents an object of the present invention.

Basically the method consists in making the output frequency produced by the oscillator directly proportional to the control voltage and inversely proportional to the square root of the supply voltage. Such an objective may be implemented by employing in place of a Schmitt trigger at the output of each inverting (delaying) stage of the ring oscillator as commonly done in the prior art VCOs, a transfer gate composed of a pair of parallel complementary switches, between the output of each inverting stage and the input of the inverting stage that follows in the chain of cascaded stages and by controlling a switch of the pair constituting the transfer gate in common with the relative current generator of the starved-inverter that constitutes the inverting stage by the control voltage and the other switch of the pair and the other current generator by the voltage difference between the supply voltage and the control voltage.

A further advantage deriving from such an embodiment of the invention is that an exceptionally high hysteresis is produced in each inverting stage of the ring oscillator, which may reach up to 80%–90% of the supply voltage, thus further increasing high frequency noise rejection ability.

Differently from the known architecture, the voltage controlled oscillator of the invention does not require a voltage-to-current converter for driving a first starved-inverter of the chain of inverters. According to the invention, the first inverting stage may be in practice a simple unit gain voltage shifting stage driven directly by the control voltage signal, while all the following inverting (delaying) stages (in an even number) are customarily starved-inverters, each followed by a transfer gate.

BRIEF DESCRIPTION OF THE DRAWINGS

The different aspects and advantages of the invention will become even more evident through the following description and analysis of an important embodiment and by referring to the annexed drawings, wherein.

DETAILED DESCRIPTION OF THE INVENTION

Figure 1:
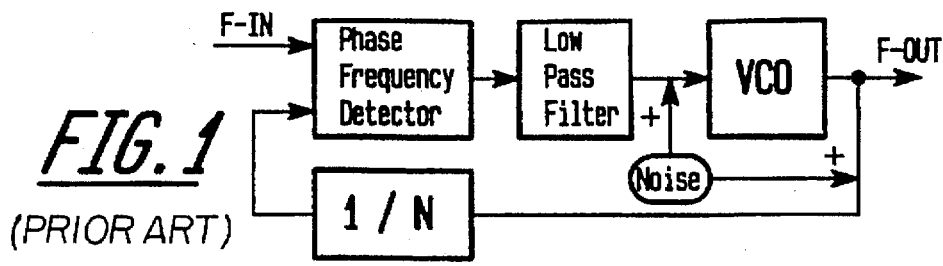
FIG. 1 is a block diagram of a conventional PLL employing a VCO.
Figure 2:
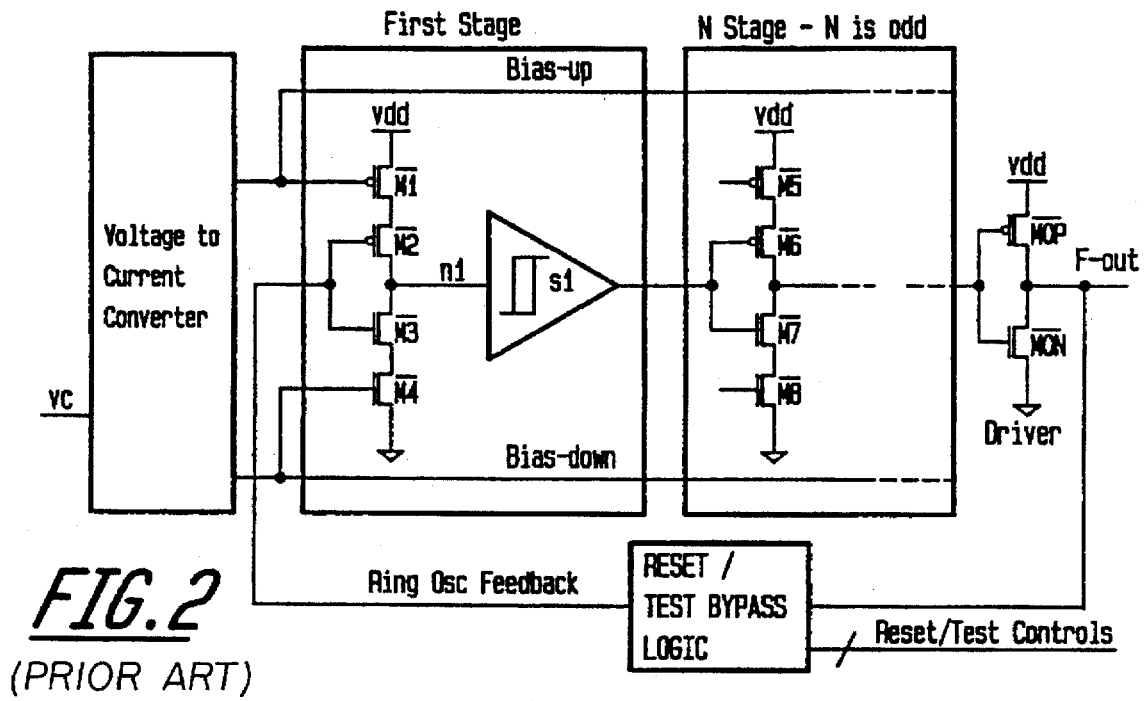
FIG. 2 shows the structure of a ring type VCO, according to a known technique.
Figure 3:
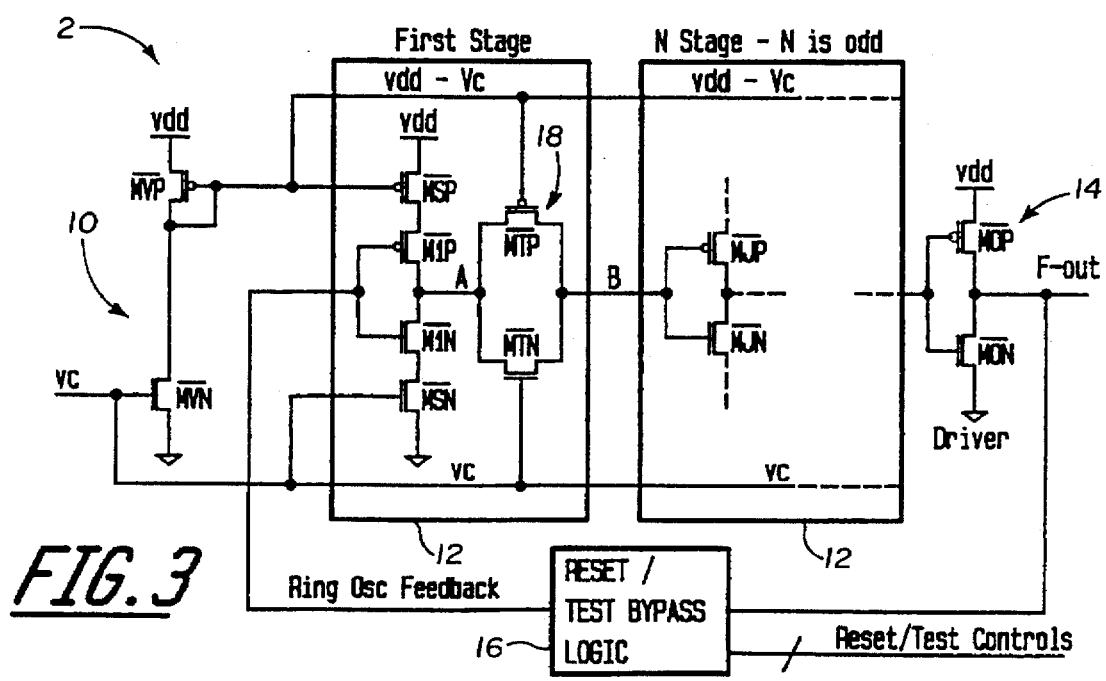
FIG. 3 is a diagram of a voltage controlled ring oscillator made according to the present invention.

Referring to the inventive VCO 2 in FIG. 3, the VCO's control circuit, responsive to a control voltage signal Vc, basically comprises of a first inverting stage in the form of a unit gain voltage shifter input stage 10, formed by a pair of complementary transistors MVN and MVP.

This input stage 10 outputs a voltage difference between the supply voltage Vdd and the control voltage Vc.

The VCO 2 further comprises a plurality of delaying inverting stages 12 of the so-called starved-inverter type, in an even number, an output driver 14 and a control logic circuitry 16 (Reset, Test By-pass Logic) functionally coupled in the feedback line of the ring oscillator. The control logic circuitry 16 may be similar to the control blocks that are normally employed in ring type VCOs for implementing a reset, stop and by-pass function for performing tests on the integrated circuit and need not be described herein.

The input stage 10 is preferably made by a pair of complementary transistors MVN and MVD designed so as to have an identical transconductance for ensuring a unit voltage gain. The input stage 10 shifts the control voltage Vc so that the following delaying inverting stages 12 cascaded therefrom which form the ring oscillator are controlled in their n-channel sections directly by the control voltage Vc and in their p-channel sections by a voltage difference between the supply voltage and the control voltage (Vdd-Vc).

An output transfer gate 18 composed of a pair of complementary transistors functionally connected in parallel is coupled to the output of each delaying inverting stage 12 that follows the first inverting stage represented by the unit gain voltage shifter input stage 10. The delaying inverting stages 12 may be in an even number so that the total number of inverters in the reaction loop of the oscillator is odd. The complementary transistors that form each output transfer gate 18 are driven in common with the respective current generators of the delaying inverting stage 12 to the output of which the transfer gate is associated, namely: by the control voltage Vc for the n-channel section and by the voltage difference Vdd-Vc for the p-channel section, respectively.

With reference to the diagram of FIG. 3, an analysis of the operation of the VCO 2 of the invention is hereinbelow reported. The analysis refers to a first delaying inverting stage 12, that follows the unit gain inverting stage that constitutes the control voltage shifting input stage 10, the load of which is represented by the pair of transistors MjN and MjP of a following delaying inverting stage 12.

As said above, the transistors MVN and MVP that form the inverting control voltage shifting input stage 10 (having a unit voltage gain) are designed so as to have the same transconductance, that is:

$$gm_{MVN}=gm_{MVP}$$

This identity of transconductance may be considered verified in the range of variation of electrical parameters due to the process spread and of the operating temperature.

Therefore, in first approximation, MSN and MSP are both biased with a same |VGS|. In fact, MSN is biased by the control voltage Vc, while MSP is biased by the difference Vdd-Vc, both referred to ground potential.

The allowed range of variation for the control voltage Vc may be set as:

$$0.25<Vc/Vdd<0.66$$

By assuming the node A charged to Vdd, the node B is also charged to Vdd and therefore the transistor M1P is ON while the transistor M1N is OFF.

In these conditions, MTN is OFF and MTP is ON. When the reaction node of the ring oscillator switches, M1N conducts and MSN starts to discharge the node A by a constant current. The voltage on the node B tracks the voltage of the node A.

When:

$$V(A)=V(B)=Vdd-Vc+|V_{TP}|=V1$$

where the $V_{TP}$ is the threshold voltage of the transistor MTP, the transistor MTP turns OFF too, thus the node B is practically disconnected from the node A and clamped to the voltage V1. The transistor MSN continues to discharge the node A through a linear voltage ramp.

When:

$$V(A)=Vc-V_{TN}=V2$$

where $V_{TN}$ is the threshold voltage of the transistor MTN, MTN rams ON, the charge distributes itself over the nodes A and B, the voltage V(B) is pulled down toward the voltage V(A) and finally both nodes A and B assume the same potential, which is much lower than the switching threshold of the following inverting stage. It should be noted that the N delaying inverting stages 12 are identical in structure to that of the first delaying inverting stage 12 and thus need not be described in detail herein. Therefore, the transistors (MjT and MjN . . . ) in the output transfer gate (not shown) of each of the successive delaying inverting stages 12 switch, thus propagating the signal through the chain of delaying inverting stages of the VCO 2.

The voltage swing of the signal in the first delaying inverting stage 12, before the following delaying inverting stage 12 switches, is therefore equal to Vdd-V2.

It may be demonstrated through similar deductions that when the node A starting from ground potential reaches the voltage Vdd, the clamp voltage V1 is given by:

$$V(A)=V(B(=Vc-V_{TN}=V1$$

while charge distribution takes place when:

$$V(A)=Vdd-Vc+|V_{TP}|=V2$$

the voltage swing being equal to V2.

In conclusion, the output signal swing of the first delaying inverting stage 12 of the VCO 2, before the following delaying inverting stage switches, in either direction, (rise and fall of the voltage on the node V(A)) is given by:

$$\Delta V=Vdd-Vc+V_T$$

on account of the assumption that:

$$V_{TN}=|V_{TP}|=V_T$$

The delay of propagation through the N+1 inverting stages that form the reaction loop of the VCO 2 is given by:

$$T_{VCO}=(N+1)C_{load}\Delta V/I_o$$

wherein $I_o$ is the charge/discharge current through MSN and MSP, that is:

$$I_o=\beta(VC-V_T)^2, \text{ where } \beta=\beta_{MSN}=\beta_{MSP}$$

considering that MSN and MSP are designed to have the same gain, the output frequency of the VCO is given by:

$$f_{VCO}=\frac{1}{2}T_{VCO}=const.\times C_{load}^{-1}\times (Vc-V_T)^2/(Vdd-Vc-V_T)$$

where $C_{load}$ is essentially the drain junction capacitance of M1N, M1P, MTN and MTP. The gate capacitances of transistors MjN and MjP are effectively decoupled from the node A and therefore they do not contribute to $C_{load}$.

By assuming a step-junction profile, the following expression may be written:

$$C_{drain}(V)=const. \times (1-V/\phi)^{-0.5}$$

where $\phi$ is constant dependent from the fabrication process.

In first approximation, $C_{load}$ corresponds to the above indicated drain capacitance, averaged over $\Delta V$, that is:

$$C_{load}=const.\times ((1+\Delta V/\phi)^{0.5}-1)/Vdd$$

Therefore, $$f_{VCO}=const. \times [Vdd/((1+\Delta V/\phi)^{0.5}-1)]\times (Vc-VT)^2/\Delta V$$

By considering the definition of the $\Delta V$ parameter, the last equation may be simplified as follows:

$$f_{VCO}=const.\times Vc/Vdd^{0.5}$$

According to premises, the output frequency produced by the VCO 2 is a linear function of the control voltage Vc, while it varies with Vdd according to an inverse square root function of the supply voltage.

A number of advantages are obtained, including a high power supply rejection, a large hysteresis and an inverse relationship between frequency and supply voltage. The PSR is improved by using Vc and the voltage difference between Vdd and Vc as driving voltages for the output transfer gate 18. A variation of 10% of Vdd results in a variation of just about 3% of the frequency generated by the VCO 2.

A large hysteresis is achieved by virtue of the difference in rising and falling input thresholds at the nodes A and B, as discussed above. Assuming, for example, that Vdd=5 V, Vc=2 V and VT=1 V, the maximum $\Delta V$ excursion that may be reached in CMOS devices may be as large as 4 V. Such a large voltage swing tends to minimize short-term instability modulation of the output frequency produced by the oscillator (jitter modulation).

The inverse relationship between the frequency and the supply voltage helps in stabilizing the loop. In fact, the dependency from Vdd of the gain of the VCO 2 compensates the reduced gain of the phase and frequency detector (PFD) at low Vdd values. This is extremely advantageous by considering that the bandwidth of a PLL depends from the product of the two gains.

Figure 4A:
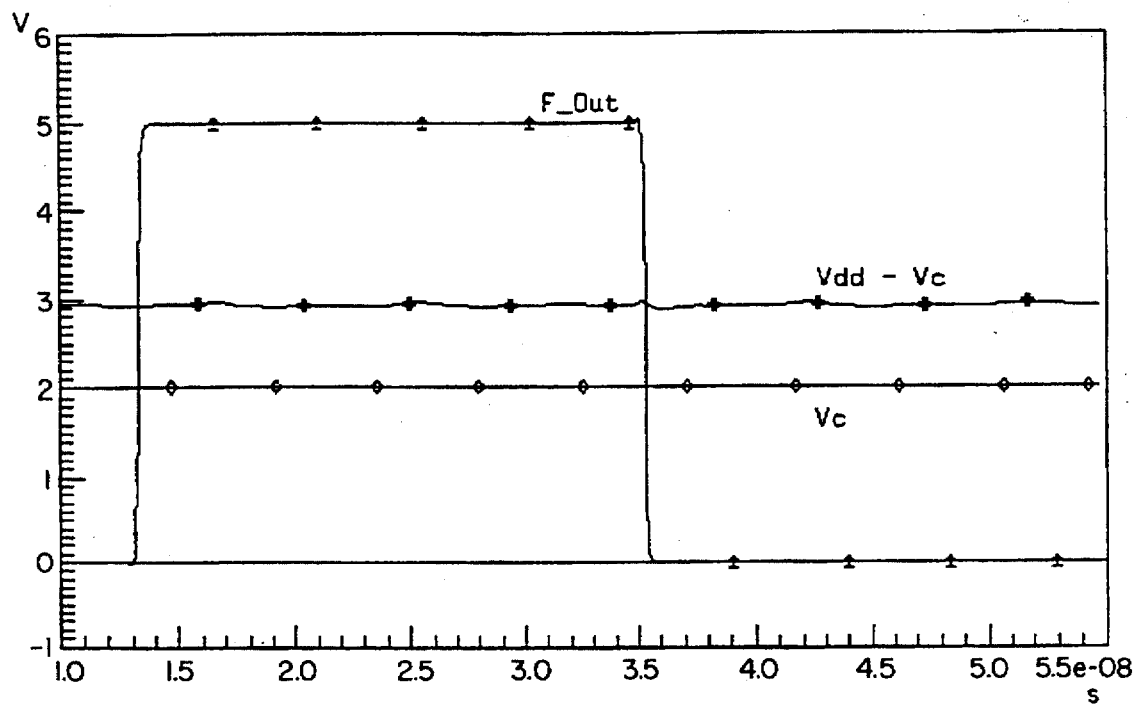
FIGS. 4a and 4b show the internal voltages of the VCO of the invention according to a simulated operation.
Figure 4B:
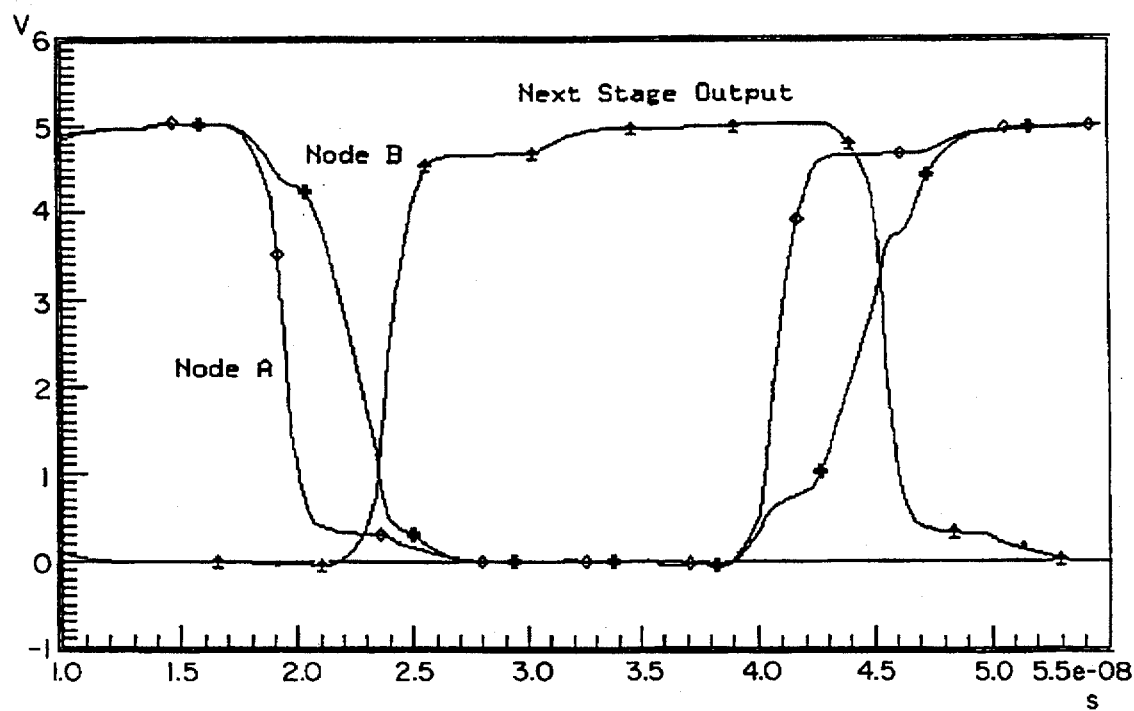
Figure 5:
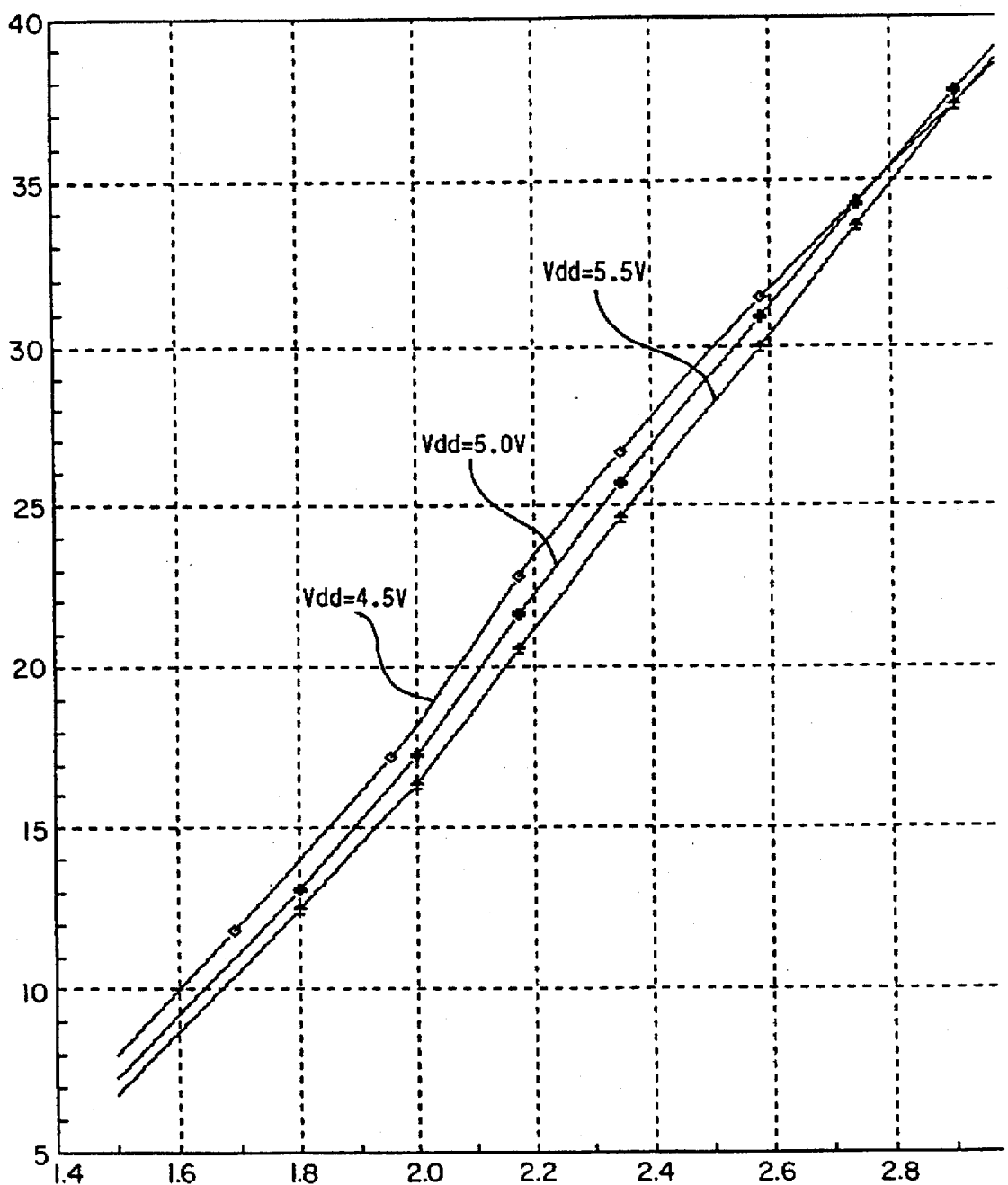
FIG. 5 shows characteristic curves of the VCO of the invention simulated for different supply voltages.

The operating parameters of the VCO 2 of FIG. 3, functioning at a nominal supply voltage of 5 V are shown as diagrams of the internal voltages in FIGS. 4a and 4b, and as a transfer characteristics of the VCO 2, for a supply voltage of 4.5 V, 5.0 and 5.5, respectively, in FIG. 5.

I claim:

1. A voltage controlled oscillator circuit powered by a supply voltage and whose frequency is selected by a control voltage, the circuit comprising:

a circuit input terminal receiving the control voltage;

a feedback input terminal;

a circuit output terminal for generating an oscillator output signal; and a positive feedback loop between said output terminal and said feedback input terminal, said positive feedback loop including an inverting stage having an inverter node, and a transfer gate comprising first and second transistors operating in parallel and coupled to said inverter node and to an output node, said first transistor being activated by a voltage having a value proportional to a difference between the supply voltage and the control voltage, said second transistor being activated by the control voltage, said transfer gate transferring an electric charge from said inverter node to said output node in response to activation of said first and second transistors.

2. The circuit of claim 1 wherein said positive feedback loop comprises a plurality of said inverting stages connected in cascade, each of said inverting stages having a said transfer gate coupled to it.

3. The circuit of claim 1 wherein said positive feedback loop comprises an odd number of said inverting stages connected in cascade, each of said inverting stages having a said transfer gate coupled to it.

4. The circuit of claim 1 wherein said first and second transistors are CMOS transistors.

5. The circuit of claim 1 wherein the voltage controlled oscillator is integrated into a single integrated circuit substrate.

6. The circuit of claim 1, further including a phase locked loop comprising a phase detector having a reference input and a phase input, said phase detector generating an error signal proportional to a difference between input signals on said reference input and said phase input, respectively, a lowpass filter coupled to said phase detector and receiving said error signal, said lowpass filter generating the control voltage, and a divider having an input coupled to said circuit output to receive said oscillator output signal, said divider generating a divided output signal coupled to said phase input.

7. The circuit of claim 6 wherein said phase locked loop and the voltage controlled oscillator are integrated onto a single integrated circuit substrate.

8. The circuit of claim 1 wherein said inverting stage comprises first and second complementary current generating transistors and first and second complementary switching transistors, said first current generating transistor being coupled to the supply voltage and responsive to said voltage having said value proportional to said difference between the supply voltage and the control voltage, said first switching transistor being coupled to said first current generating transistor to receive current therefrom, said first switching transistor being responsive to a signal on said feedback input terminal to transfer current to said inverter node, said second switching transistor being coupled to said inverter node transferring current therefrom, said second switching transistor being responsive to said signal on said feedback input terminal, said second current generating transistor being coupled to a reference voltage and responsive to the control voltage to control transfer of current from said inverter node through said second switching transistor.

9. The circuit of claim 8 wherein said current generating transistors and said switching transistors are CMOS transistors.

10. The circuit of claim 1, further including a unity gain input stage to receive the control voltage and generate said value proportional to said difference between the supply voltage and the control voltage.

11. The circuit of claim 10 wherein said input stage comprises first and second complementary input transistors functionally connected in series between the supply voltage and a reference voltage, said first input transistor being diode-configured and coupled to the supply voltage, said second input transistor being coupled to said first input transistor to form an input node and to the reference voltage, said second transistor being responsive to said control voltage to generate, at said input node, said value proportional to said difference between the supply voltage and the control voltage.

12. A phase locked loop circuit powered by a supply voltage, the circuit comprising:

a phase detector having a reference input terminal and a phase input terminal, said phase detector generating an error signal proportional to a difference between input signals on said reference input terminal and said phase input terminal, respectively;

a lowpass filter coupled to said phase detector and receiving said error signal, said lowpass filter generating a control voltage;

a voltage controlled oscillator circuit having an oscillator input terminal receiving said control voltage, a feedback input terminal, an oscillator output terminal generating an oscillator output signal, and a positive feedback loop between said oscillator output terminal and said feedback input terminal, said positive feedback loop including an inverting stage having an inverter node, and a transfer gate comprising first and second transistors operating in parallel and coupled to said inverter node and to an output node, said first transistor being activated by a voltage having a value proportional to a difference between the supply voltage and said control voltage, said second transistor being activated by said control voltage, said transfer gate transferring an electric charge from said inverter node to said output node in response to activation of said first and second transistors; and a divider having an input terminal coupled to said oscillator output terminal to receive said oscillator output signal and a divider output coupled to said phase input terminal.

13. The circuit of claim 12 wherein said positive feedback loop comprises a plurality of said inverting stages connected in cascade, each of said inverting stages having said transfer gate.

14. The circuit of claim 12, further including a unity gain input stage on said voltage controlled oscillator to receive the control voltage and generate said value proportional to said difference between the supply voltage and the control voltage.

15. The circuit of claim 14 wherein said input stage comprises first and second complementary input transistors functionally connected in series between the supply voltage and a reference voltage, said first input transistor being diode-configured and coupled to the supply voltage, said second input transistor being coupled to said first input transistor to form an input node and to the reference voltage, said second transistor being responsive to said control voltage to generate, at said input node, said value proportional to said difference between the supply voltage and the control voltage.

16. The circuit of claim 12 wherein the phase locked loop is integrated onto a single integrated circuit substrate.

17. A voltage controlled oscillator comprising a plurality of delaying inverting stages connected in cascade and forming a positive feedback loop, each delaying inverting stage being comprised of a pair of complementary switches driven in common and a pair of complementary current generators, connected between the switches and a supply node and a ground node of the circuit, respectively, and control means responsive to a control voltage, characterized by comprising:

a transfer gate composed of a pair of complementary switches connected in parallel, functionally coupled to the output of each inverting stage and to the input of a following inverting stage of said plurality of stages connected in cascade;

each of said complementary switches of each transfer gate being controlled in common with the relative current generator of the inverting stage to the output node of which the transfer gate is coupled; and a switch of said transfer gate and a current generator being controlled by said control voltage while the other switch of said transfer gate and current generator being controlled by a voltage difference between the supply voltage and said control voltage.

18. The voltage controlled oscillator according to claim 17, made in CMOS technology, wherein said complementary pairs of switches and current generators are formed by integrated CMOS structures.

19. The voltage controlled oscillator according to claim 18 wherein the ratio between said control voltage and the supply voltage is comprised between 0.25 and 0.66.

20. The voltage controlled oscillator according to claim 17 wherein said control means comprise a unit gain, inverting voltage shifting stage composed of a pair of complementary transistors functionally connected in series between said supply node and said ground node, the n-channel transistor of the pair being driven through a gate thereof by said control voltage while a diode-configured p-channel transistor of said pair has a gate and a source connected in common to the drain of the n-channel transistor, constituting a node biased at said difference voltage.

21. The voltage controlled oscillator according to claim 20 wherein said voltage shifting stage transistors have identical transconductance.

22. A method for reducing short-term instability of the output frequency produced by a voltage controlled ring oscillator due to noise coming from the supply rails and from the control voltage line, characterized by:

making the frequency produced by the oscillator linearly proportional to the control voltage and inversely proportional to the square root of the supply voltage.

23. A method for generating a voltage controlled oscillator output for use in a circuit powered by a supply voltage and whose frequency is selected by a control voltage, the method comprising the steps of:

receiving the control voltage;

generating a difference voltage proportional to a difference between the supply voltage and the control voltage;

generating an oscillator output signal; and providing positive feedback from said oscillator output signal to an oscillator feedback input, said positive feedback having variations that are linearly dependent on the control voltage and inversely proportional to a square root of variations in the power supply.

* * * * *